(12) United States Patent
Lee et al.

(10) Patent No.: US 7,248,064 B2
(45) Date of Patent: Jul. 24, 2007

(54) PROBE CARD AND METHOD FOR PRODUCING THE SAME

(75) Inventors: Dai-Gil Lee, Daejeon (KR); Seong-Su Kim, Geojae-si (KR); Byung-Chul Kim, Daejeon (KR); Dong-Chang Park, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 11/287,455

(22) Filed: Nov. 28, 2005

(65) Prior Publication Data

US 2006/0232286 A1    Oct. 19, 2006

(30) Foreign Application Priority Data

Apr. 14, 2005    (KR) ...................... 10-2005-0031100

(51) Int. Cl.
*G01R 31/02* (2006.01)
(52) U.S. Cl. ..................................... 324/754
(58) Field of Classification Search ..................... None
See application file for complete search history.

(56) References Cited

U.S. PATENT DOCUMENTS

| | | | | |
|---|---|---|---|---|
| 4,975,086 A | * | 12/1990 | Reichardt et al. | 439/629 |
| 5,151,653 A | * | 9/1992 | Yutori et al. | 324/754 |
| 5,220,270 A | * | 6/1993 | Peickert | 320/107 |
| 5,259,777 A | * | 11/1993 | Schuder et al. | 439/188 |
| 5,466,161 A | * | 11/1995 | Yumibe et al. | 439/66 |
| 6,050,857 A | * | 4/2000 | Lok | 439/630 |
| 6,231,395 B1 | * | 5/2001 | Odic | 439/630 |
| 6,426,638 B1 | * | 7/2002 | Di Stefano | 324/754 |
| 6,509,529 B2 | * | 1/2003 | Kamath et al. | 174/255 |
| 2006/0049840 A1 | * | 3/2006 | Ito et al. | 324/754 |

* cited by examiner

*Primary Examiner*—Paresh Patel
(74) *Attorney, Agent, or Firm*—Lowe Hauptman & Berner

(57) ABSTRACT

A probe card is used in conducting a visual test for a target test object through simultaneous contact of the probe card with each and every electrode pad of the target test object. The probe card includes a plurality of probes composed of conductive wire strands and having elastically deformable contact parts so curved as to make contact with electrode pads of a target test object. The contact parts are oriented in one and the same direction and extend in a parallel relationship with one another. The probe card further includes a first insulating block for fixedly securing one end parts of the probes, a second insulating block for fixedly securing the other end parts of the probes and a mounting plate for holding the first and second insulating blocks in such a manner that the contact parts of the probes protrude outwardly.

8 Claims, 15 Drawing Sheets

PROBE CARD AND METHOD FOR PRODUCING THE SAME

FIELD OF THE INVENTION

The present invention is directed to a probe card and a method for producing the same, and more specifically to a probe card for use in conducting a visual test for a target test object through simultaneous contact of the probe card with each and every electrode pad of the target test object and a method for producing such a probe card.

BACKGROUND OF THE INVENTION

In the field of manufacturing flat-panel displays such as a thin-film transistor-liquid crystal display (TFT-LCD), a plasma display panel (PDP), an organic electroluminescence (OEL) and the like, a panel is produced through the use of a glass substrate and electrode pads and, in the final test stage of a cell process, the entire electrode pads of a data/gate line are brought into simultaneous contact with a probe card or a probe unit at a probing station. Electric signals are then applied to the electrode pads of the data/gate line through the probe card to thereby test the electrical property thereof, which is referred to as a visual test.

Turning to semiconductor chips, they are manufactured through a number of steps, including steps of producing a wafer, inspecting the wafer and packaging a die. The wafer inspecting step is carried out by what is called an electrical die sorting inspection that tests the semiconductor chips for their electrical property. In the electrical die sorting inspection, a probe card is brought into direct contact with electrode pads of each of the semiconductor chips at a probing station, after which electrical signals are applied to the electrode pads to conduct the electrical property test. Depending on the test results, the semiconductor chips are sorted into qualified products and defective products.

As an example of prior art probing tools, a probe card is composed of an array of small-sized metal needle probes. The needle probes are caused to make contact with electrode pads of a target test object, e.g., a panel of flat-panel displays or a semiconductor chip. Subsequently, electrical signals are applied to through the needle probes to test the electrical connection of the electrode pads.

With the needle type probe card known in the art, each of the metal needle probes can make contact with the corresponding electrode pad at a contact point of reduced size and hence the probe card may be advantageously employed in testing objects with high density electrode pads. However, due largely to the fact that the needle probes are of cantilever type, the smaller the diameter of the individual probes, the weaker the force by which the probes can be pressed against the electrode pads. This involves a problem in that no stable contact can be maintained between the probes and the electrode pads. Another problem posed by the needle type probe card is that, if the narrowly spaced-apart probes are subject to flexural deformation, a short-circuit may arise between the probes thus causing a fatal damage to the electric circuits of the object tested.

Moreover, the task of uniformly aligning the individual probes in the process of producing the prior art probe card has heretofore been performed by manual operations of a worker, which reduces the productivity and the degree of precision of the products.

In recent years, a need exists to form solder balls on a semiconductor chip in advance of conducting a test. During the course of testing the semiconductor chip with solder balls, however, the probes tend to be slipped from the solder balls, thus making it difficult to conduct the test and shortening the life span of the probes.

As another example of the prior art probing tools, a probe card has been proposed of the type comprising an insulating sheet and a plurality of elongated leads disposed on the insulating sheet. A metallic material is plated and built up on the insulating sheet in an effort to miniaturize the pitch of the leads. Attached to one side of the insulating sheet is a holder from which terminals of the insulating sheet and rear terminals of the leads extend. The leads have front terminals which are flexurally deformed under pressure to make contact with electrode pads of a semiconductor chip in a resiliently yieldable manner.

The lead type probe card is disadvantageous in that the leads are unevenly built up by plating and therefore have no uniform thickness, thereby resulting in poor contact between the leads of the probe card and the electrode pads of an object tested. In addition, the leads are bonded to the insulating sheet in a small area, as a result of which the front terminals of the leads may be separated from the insulating sheet when the insulating sheet and the leads are subject to repeated flexural deformation.

As a further example of the prior art probing tools, there has been proposed a probe card that is provided with blade-type probes. The blade-type probes are fabricated by forming slits in an insulator made of, e.g., ceramics, and fitting tips into the slits. The task of fitting the tips is conducted manually by a worker, which is disadvantageous in terms of the productivity and the production costs. Furthermore, the probes of this type are cumbersome and inconvenient to change.

SUMMARY OF THE INVENTION

Taking into account the above and other problems inherent in the prior art probe cards, it is an object of the present invention to provide a probe card that, while exhibiting excellent durability and improved reliability, can enhance elastic deformability of individual conductive probes and accommodate positional errors between the probes and electrode pads of a target test object, thereby assuring stabilized and reliable contact of the probes with the electrode pads.

Another object of the present invention is to provide a probe card whose individual probes can be produced, fitted and changed with ease, thus enabling the probe card to be produced with increased productivity and reduced production costs.

A further object of the present invention is to provide a probe card that can positively prevent occurrence of short-circuit between individual probe cards through the use of simple and easy-to-form insulating means.

A still further object of the present invention is to provide a method for producing a probe card whereby a probe card having enhanced reliability can be produced with increased productivity and reduced costs.

With these objects in view, according to one aspect of the present invention, there is provided a probe card, comprising: a plurality of probes composed of conductive wire strands and having elastically deformable contact parts so curved as to make contact with electrode pads of a target test object, the contact parts oriented in one and the same direction and extending in a parallel relationship with one another; a first insulating block for fixedly securing one end parts of the probes; a second insulating block for fixedly securing the other end parts of the probes; and a mounting plate for holding the first and second insulating blocks in such a manner that the contact parts of the probes protrude outwardly from between the first and second insulating blocks.

According to another aspect of the present invention, there is provided a probe card, comprising: a plurality of probes composed of conductive thin plates and extending in a parallel relationship with one another for avoidance of short-circuit, each of the probes having first and second contact parts at its top opposite sides and first and second coupling recesses at its bottom opposite sides; first and second support bases respectively coupled with the first and second coupling recesses; an insulating means for preventing the probes from short-circuiting; and first and second embracing plates provided at opposite ends of the first and second support bases for pressing the probes against one another.

According to a further aspect of the present invention, there is provided a method for producing a probe card, comprising the steps of: aligning a plurality of conductive wire strands in a parallel relationship with one another in such a manner as to avoid occurrence of short-circuit; fixedly securing one end parts of the conductive wire strands to a first insulating block; fixedly securing the other end parts of the conductive wire strands to a second insulating block so that intermediate parts of the conductive wire strands can extend between the first and second insulating blocks; attaching the first insulating block to a mounting plate; crushing the intermediate parts of the conductive wire strands in their longitudinal directions to form curved contact parts; and attaching the second insulating block to the mounting plate in a spaced-apart relationship with respect to the first insulating block.

BRIEF DESCRIPTION OF THE DRAWINGS

The above and other objects, features and advantages of the present invention will become apparent from the following description of a preferred embodiment given in conjunction with the accompanying drawings, in which.

DETAILED DESCRIPTION OF THE INVENTION

Preferred embodiments of a probe card according to the present invention and a method for producing the same will now be described in detail with reference to the accompanying drawings.

Figure 1:
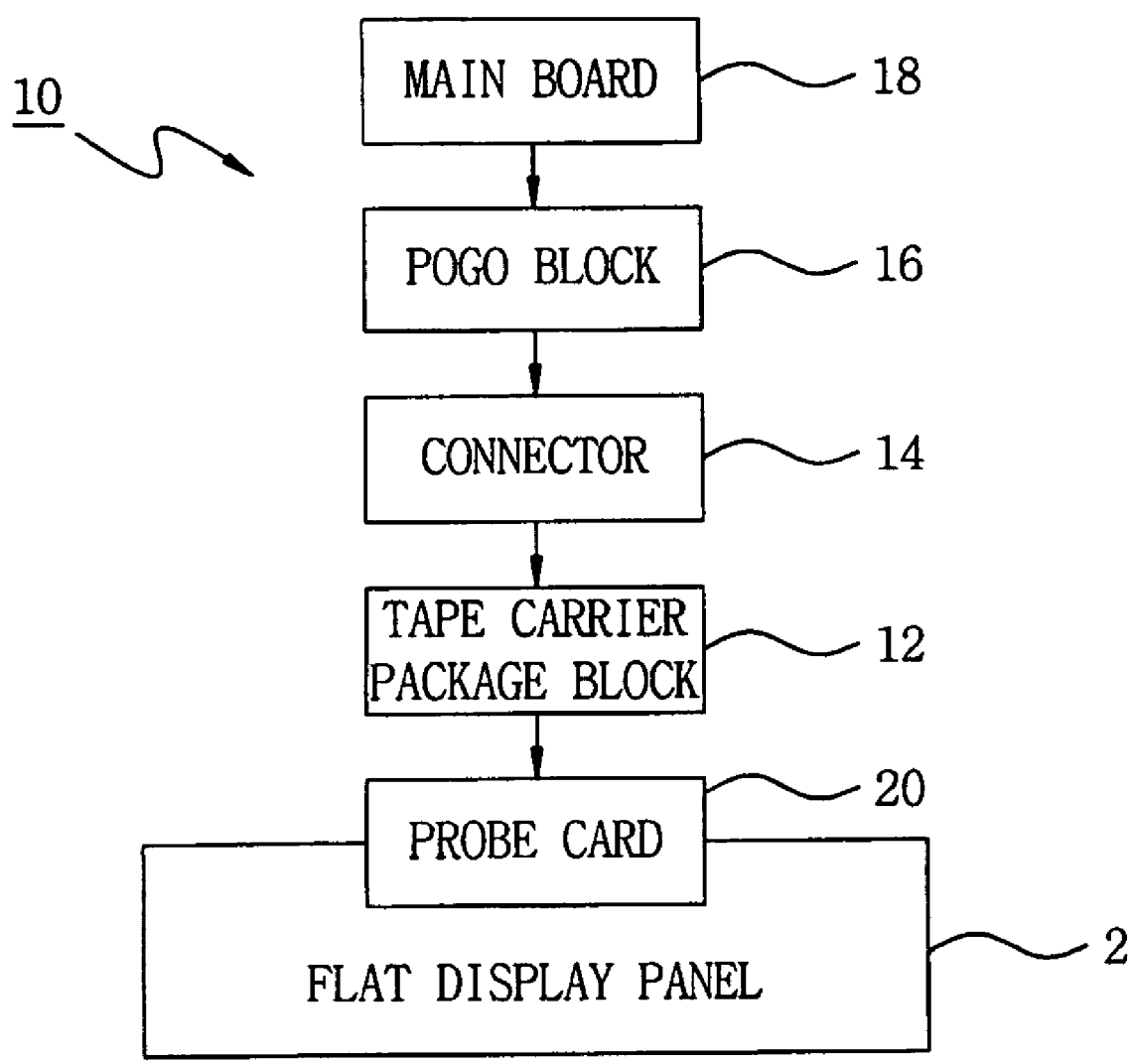
FIG. 1 is a block diagram showing an example of a probing station that incorporates a probe card according to the present invention.

Referring first to FIG. 1, there is shown an example of a probing station that incorporates a probe card according to the present invention. As shown in FIG. 1, the probing station 10 is provided with a probe card 20 according to the present invention which can be brought into contact with electrode pads of a target test object, e.g., a flat display panel. The probe card 20 is connected to a tape carrier package block (TCP) 12 which in turn is connected to a pogo block 16 by means of a connector 14. The pogo block 16 is connected to a main board 18. The connector 14 is composed of a flexible printed circuit. The pogo block 16 denotes an interface board for transmitting signals between the main board 18 and the probe card 20 in the probing station. Although FIG. 1 shows the probe card 20 as applied to an input side of the probing station 10, it would be possible to apply the probe card 20 to an output side thereof.

Figure 2:
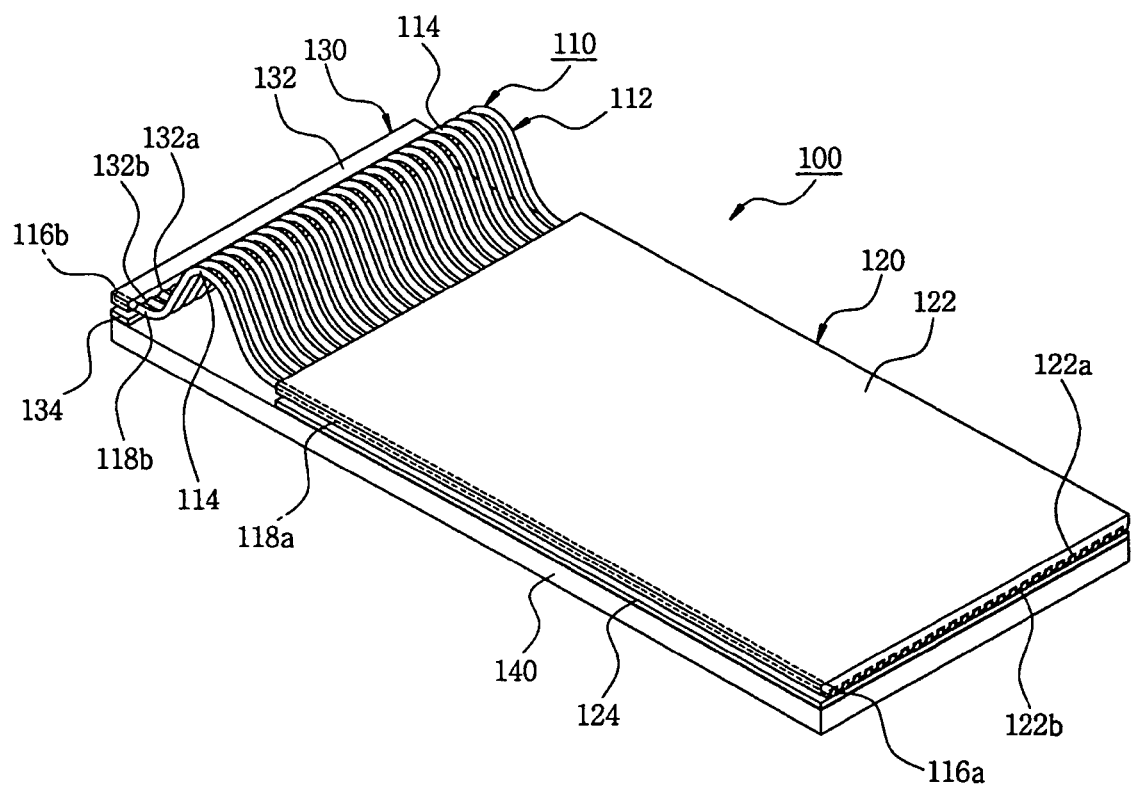
FIG. 2 is a perspective view showing a probe card in accordance with a first embodiment of the present invention.

FIG. 2 shows a probe card in accordance with a first embodiment of the present invention. Referring to FIG. 2, the probe card 100 of the first embodiment is provided with a plurality of probes 110 that can make contact with, and apply electric signals to, electrode pads of a target test object, e.g., a flat display panel or a semiconductor chip. The probes 110 are composed of elongated conductive wire strands 112.

Figure 3A:
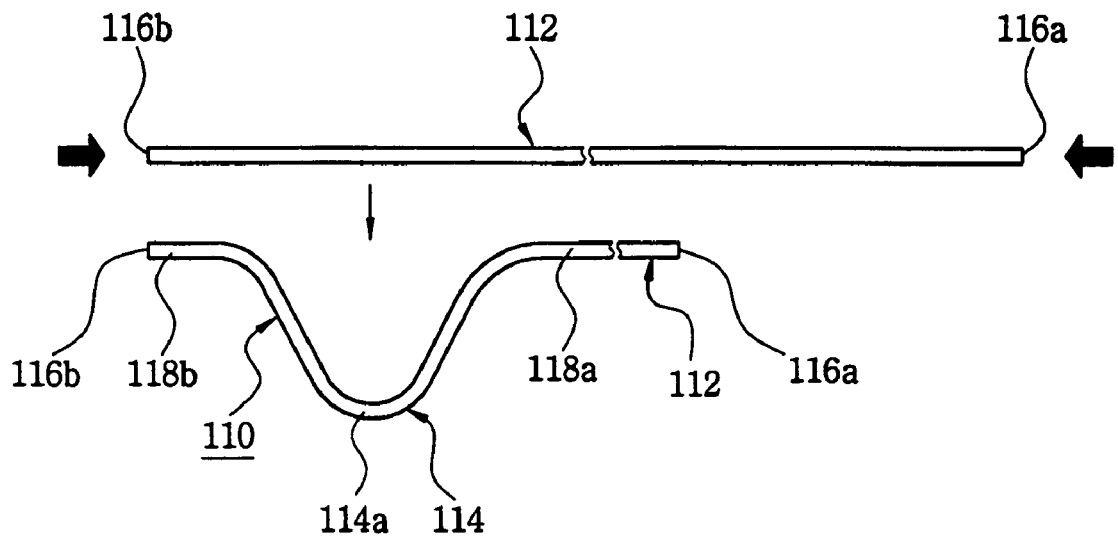
FIGS. 3a through 3c are front views showing individual probes employed in a probe card according to a first embodiment of the present.
Figure 3B:
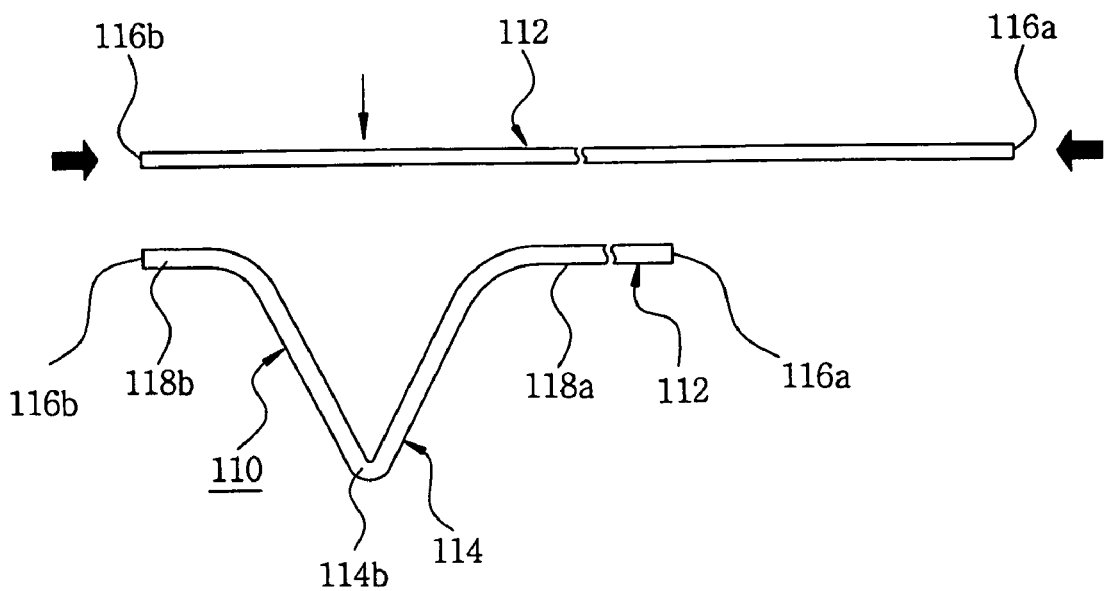

Referring to FIGS. 3a through 3b, the conductive wire strands 112 are provided with elastically deformable contact parts 114, 114a, 114b, 114c of varying configuration which can make direct contact with the electrode pads of the target test object. The conductive wire strands 112 may be made of, but are not limited to, metal, carbon fibers and other conductive materials. Depending on the circumstances, the conductive wire strands 112 may be either of solid type or hollow type.

As shown in FIG. 3a, each of the conductive wire strands 112 is crushed in its longitudinal direction and partially curved to create an elastically deformable contact part 114a of generally arcuate shape, with one end 116a and the other end 116b of the conductive wire strands 112 left free. Each of the conductive wire strands 112 is further provided with a first straight part 118a adjoining the one end 116a of the conductive wire strands 112 and a second straight part 118b adjoining the other end 116b, both of which are of rectilinear configuration. The arcuate contact part 114a is brought into contact with the electrode pads of the target test object at its apex. Turning to FIG. 3b, each of the conductive wire strands 112 is crushed in its longitudinal direction and partially curved to create an elastically deformable contact part 114b of generally triangular shape, with one end 116a and the other end 116b of the conductive wire strands 112 left free. Each of the conductive wire strands 112 is further provided with a first straight part 118a and a second straight part 118b, both of which are of rectilinear configuration. The triangular contact part 114b is brought into contact with the electrode pads of the target test object at its apex.

Figure 3C:
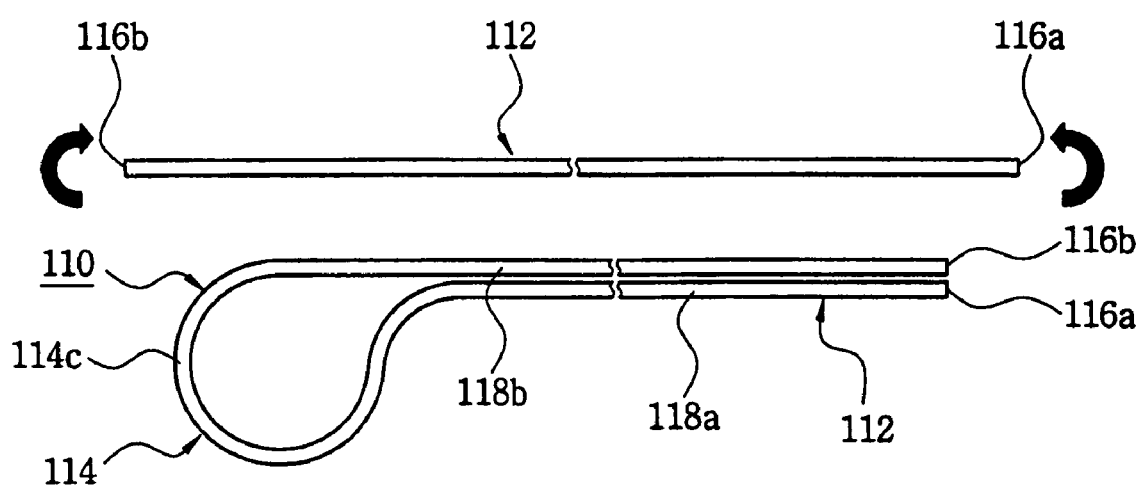

Referring to FIG. 3c, each of the conductive wire strands 112 is partially bent to create an elastically deformable contact part 114c of generally loop shape, with one end 116a and the other end 116b of the conductive wire strands 112 left free. Each of the conductive wire strands 112 is further provided with a first straight part 118a and a second straight part 118b, both of which are in a parallel relationship with each other.

Referring again to FIG. 2, the first and second straight parts 118a, 118b are respectively fixedly secured to a first insulating block 120 and a second insulating block 130. The conductive wire strands 112 extend between the first insulating block 120 and the second insulating block 130 in a spaced-apart relationship with one another for avoidance of inadvertent short-circuit. The curved contact parts 114 of the conductive wire strands 112 protrude outwardly form between the first and second insulating blocks 120, 130 and are oriented in one and the same direction.

Each of the first and second insulating blocks 120, 130 are halved into a first plate 122 or 132 and a second plate 124 or 134. Alternately formed on the first plate 122 or 132 are a plurality of channels 122a or 132a for receiving the first and second straight parts 118a, 118b of the conductive wire strands 112 and a plurality of ridge-like spacers 122b, 132b for keeping the conductive wire strands 112 spaced apart. In the present embodiment, it would be possible to eliminate the channels 122a or 132a and the ridge-like spacers 122b, 132b, if needed.

The second plate 124 or 134 of the first and second insulating blocks 120, 130 is affixed to a mounting plate 140. The conductive wire strands 112, the second plate 124 or 134 of the first and second insulating blocks 120, 130 and the mounting plate 140 are joined together by means of a fastener means such as adhesive bonding, bolting, snap hooking or the like.

Such conductive wire strands 112 are pre-stressed under a condition that the one end 116a and the other end 116b thereof are restricted, and therefore serve as curved beams in terms of shape and two end-fixed beams structurally, which type of beams exhibit increased flexural stiffness and improved durability. This means that the contact parts 114 of the conductive wire strands 112 are not susceptible to plastic deformation when they are pressed against the electrode pads by a vertically exerting load, while the contact area between the contact parts 114 and the electrode pads are increased so as to reduce electric resistance and heat generation.

Additionally, it becomes possible to reduce the cross-sectional area of each of the conductive wire strands 112 while maintaining the flexural stiffness thereof at the same level as the conventional needle type probes. This assures that a probe card can be produced in conformity with the electrodes of a target test object disposed at high density. Moreover, the contact parts 114 of the conductive wire strands 112 can be elastically deformed in such a manner that they accommodate positional errors between the conductive wire strands 112 and the electrode pads. This assures stabilized contact between the contact parts 114 and the electrode pads and drastically improves contact-keeping ability of the conductive wire strands 112, thus making it possible to conduct the test in a reliable manner. It should be appreciated that the shape of the contact parts 114 may be changed to other suitable ones, although the contact parts 114 are shown and described to have arcuate, triangular and loop configurations in the present embodiment.

Figure 4:
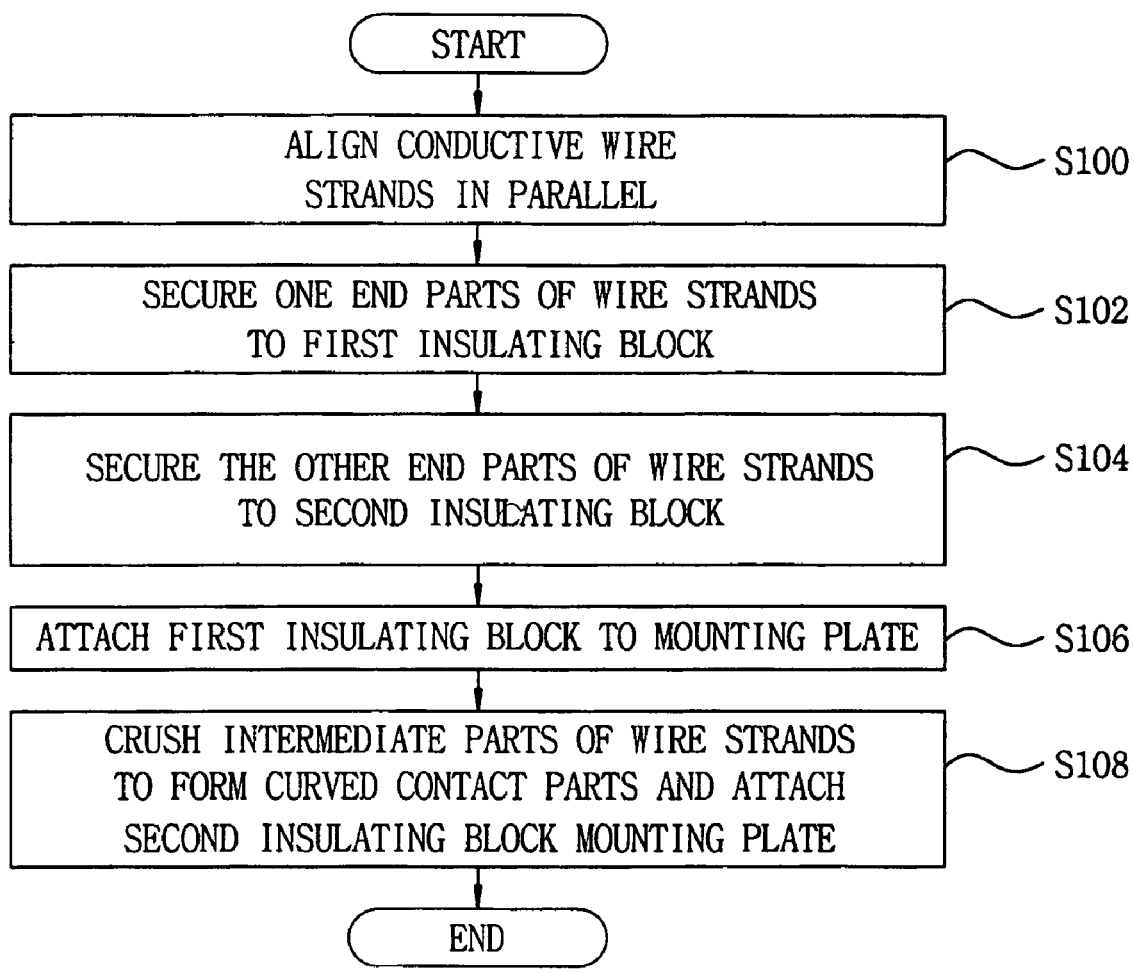
FIG. 4 is a flowchart illustrating a method for producing a probe card according to a first embodiment of the present.

With reference to FIG. 4, description will now be offered regarding a method for producing a probe card in accordance with a first embodiment of the present invention.

Initially, a plurality of conductive wire strands 112 are aligned and disposed in a spaced-apart parallel relationship with one another in a fashion that no short-circuit can occur between the conductive wire strands 112 (S100). The parts of the conductive wire strands 112 adjoining one end 116a thereof are disposed between first and second plates 122, 124 of a first insulating block 120 and then fixedly secured to the first insulating block 120 (S102). The parts of the conductive wire strands 112 adjoining the other end thereof are disposed between first and second plates 132, 134 of a second insulating block 130 and then fixedly secured to the second insulating block 130 while leaving free intermediate parts (corresponding to contact parts 114 to be formed later) of the conductive wire strands 112 (S104). During this process, first and second straight parts 118a, 118b of the conductive wire strands 112 are respectively received in channels 122a, 132a of the first plates 122, 132.

At a next step, the first insulating block 120 is attached to one end side of the mounting plate 140 (S106). The intermediate parts of the conductive wire strands 112 are crushed in their longitudinal directions to form curved contact parts 114, after which the second insulating block 130 is attached to the other end side of the mounting plate 140 (S108) in a spaced-apart relationship with respect to the first insulating block 120. By way of the probe card production method according to a first embodiment of the present invention, a probe card 100 can be produced that comprises a plurality of probes 110 having contact parts 114a of arcuate configuration or contact parts 114b of triangular configuration. It should be appreciated that the step of crushing the intermediate parts of the conductive wire strands 112 may be performed in advance of the step of attaching the first insulating block 120 to one end side of the mounting plate 140.

In order to produce a probe card 100 with the use of probes 110 composed of conductive wire strands 112 having loop-shaped contact parts 114c as shown in FIG. 3c, first straight parts 118a of the conductive wire strands 112 are fixedly secured to a first insulating block 120 (see FIG. 2) which in turn is attached to one end side of a mounting plate 140. Then, second straight parts 118b of the conductive wire strands 112 are fixedly secured to a second insulating block 130 which in turn is attached either to the mounting plate 140 at the same side as the first insulating block 120 or to the first insulating block 120. Through this process, it becomes possible to produce a probe card composed of conductive wire strands 112 whose opposite ends are restricted in such a manner as to pre-stress loop-shaped contact parts 114c thereof. In this type of probe card, the second straight parts 118a, 118b may altogether be secured either to the first insulating block 120 or the second insulating block 130.

Figure 5:
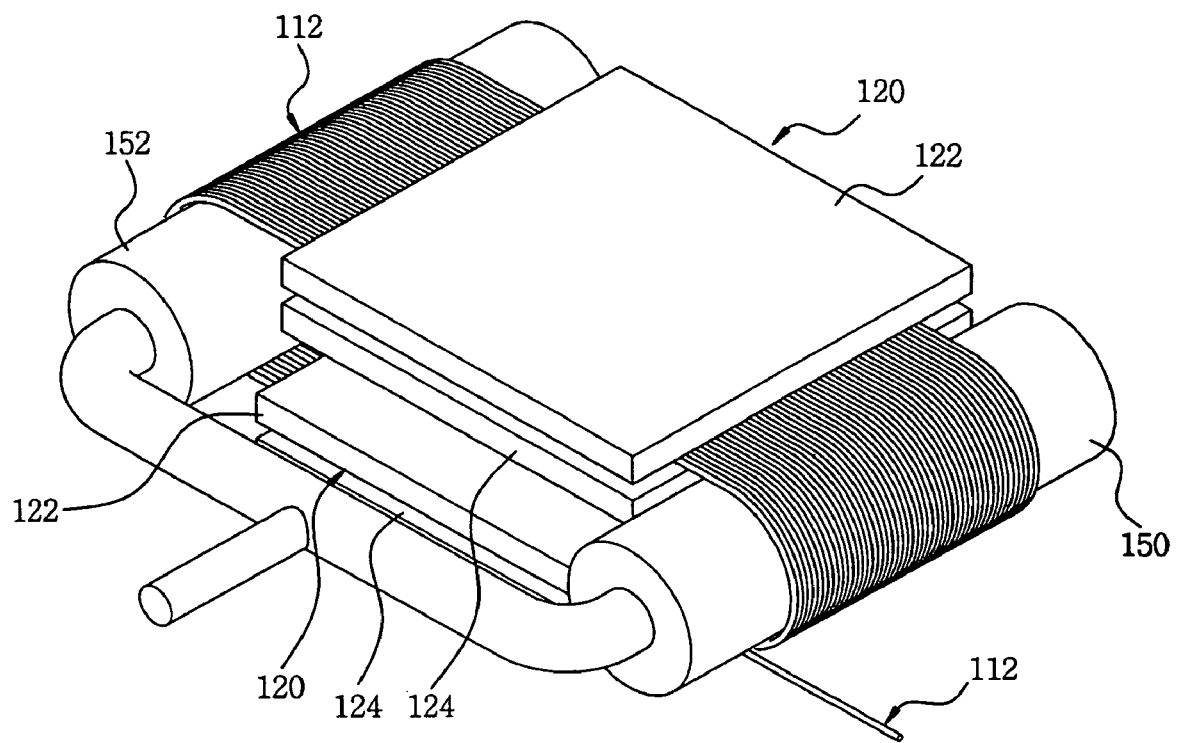
FIG. 5 is a perspective view showing an exemplary method of aligning conductive wire strands in a method for producing a probe card according to a first embodiment of the present.

Referring to FIG. 5, there is illustrated an exemplary manner whereby the conductive wire strands 112 are aligned between, and fixedly secured to, the first and second plates 122, 124 of the first insulating block 120 in the probe card production method according to a first embodiment of the present invention.

As shown in FIG. 5, an elongated conductive wire is wound in plural turns around first and second spools 150, 152 spaced apart at a predetermined spacing in such a manner that a plurality of conductive wire strands 112 are aligned in a parallel relationship with one another. The conductive wire strands 112 thus extend rectilinearly and are spaced apart at a predetermined spacing.

The conductive wire strands 112 wound around the first and second spools 150, 152 are interposed between, and fixedly secured to, the first and second plates 122, 124 of the first insulating block 120. It can be seen in FIG. 5 that two separate first insulating blocks 120 are employed to clamp upper and lower extensions of the conductive wire strands 112 wound around the first and second spools 150, 152. Then, the conductive wire strands 112 secured to the first insulating block 120 are severed at their opposite end parts. In other words, the severing is conducted at one end parts of the conductive wire strands 112 contiguous to the first spool 150 and at the other end parts of the conductive wire strands 112 contiguous to the second spool 152 so that intermediate parts can extend between the other end parts of the conductive wire strands 112 and the first insulating block 120. In this manner, the conductive wire strands 112 can be precisely aligned and secured in place by use of the first and second plates 122, 124 of the first insulating block 120. It would be possible to change the diameter of the conductive wire strands 112 by regulating the tensile force imparted to the conductive wire strands 112.

Figure 6:
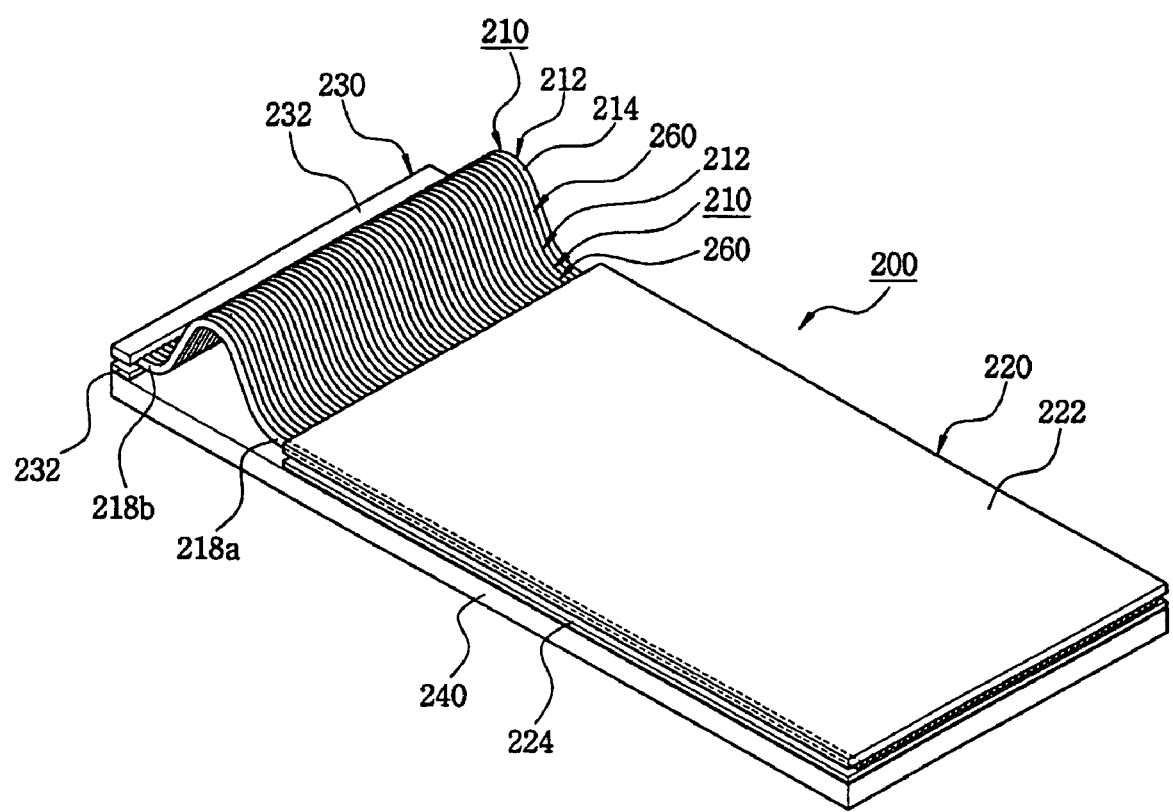
FIG. 6 is a perspective view showing a probe card in accordance with a second embodiment of the present invention.

FIG. 6 shows a probe card in accordance with a second embodiment of the present invention. Just like the probe card 100 of the first embodiment, a probe card 200 according to the second embodiment of the present invention comprises probes 210 composed of conductive wire strands 212, a first insulating block 220, a second insulating block 230 and a mounting plate 240. The conductive wire strands 212 are provided with contact parts 214 protruding outwardly from between the first and second insulating blocks 220, 230 in one and the same direction.

A plurality of insulating wire strands 260 are disposed in between the conductive wire strands 212 for avoidance of inadvertent short-circuit. The insulating wire strands 260 are made of, e.g., a resin-impregnated wire ("SPECTRA" produced and sold by Honeywell Corp., U.S.A.) and a nylon wire. As shown in FIG. 5, the conductive wire strands 212 and the insulating wire strands 260 are alternately wound around the first and second spools 150, 152 in a mutually parallel relationship, after which they are interposed between and fixedly secured to a first plate 222 and a second plate 224 of the first insulating block 220. In order to increase the density of the conductive wire strands 212, it is necessary to wind the conductive wire strands 212 and the insulating wire strands 260 on the first and second spools 150, 152 as closely as possible.

Referring collectively to FIGS. 5 and 6, in a method for producing a probe card according to a second embodiment, one of upper and lower extensions of the conductive wire strands 212 and the insulating wire strands 260 extending between the first and second spools 150, 152 are fixedly secured to between the first and second plates 222, 224 of the first insulating block 220. Subsequently, the conductive wire strands 212 and the insulating wire strands 260 secured to the first insulating block 220 are severed at their opposite end parts. More specifically, the severing is conducted at one end parts of the conductive wire strands 212 and the insulating wire strands 260 contiguous to the first spool 150 and at the other end parts thereof contiguous to the second spool 152 so that intermediate parts can extend between the other end parts and the first insulating block 220.

Then, the other end parts of the conductive wire strands 212 and the insulating wire strands 260 are fixedly secured to between the first and second plates 232, 234 of the second insulating block 230. The first insulating block 220 is attached to one end side of the mounting plate 240. The intermediate parts of the conductive wire strands 212 and the insulating wire strands 260 are crushed in their longitudinal directions to form curved contact parts 214 on the conductive wire strands 212, after which the second insulating block 230 is attached to the other end side of the mounting plate 240 in a spaced-apart relationship with respect to the first insulating block 220. By way of attaching the first and second blocks 220, 230 to the opposite end sides of the mounting plate 240, the elastically deformable contact parts 214 are created on intermediate parts of the conductive wire strands 212 between the first and second blocks 220, 230. The same curved parts as the contact parts 214 of the conductive wire strands 212 are formed on the insulating wire strands 260.

Figure 7:
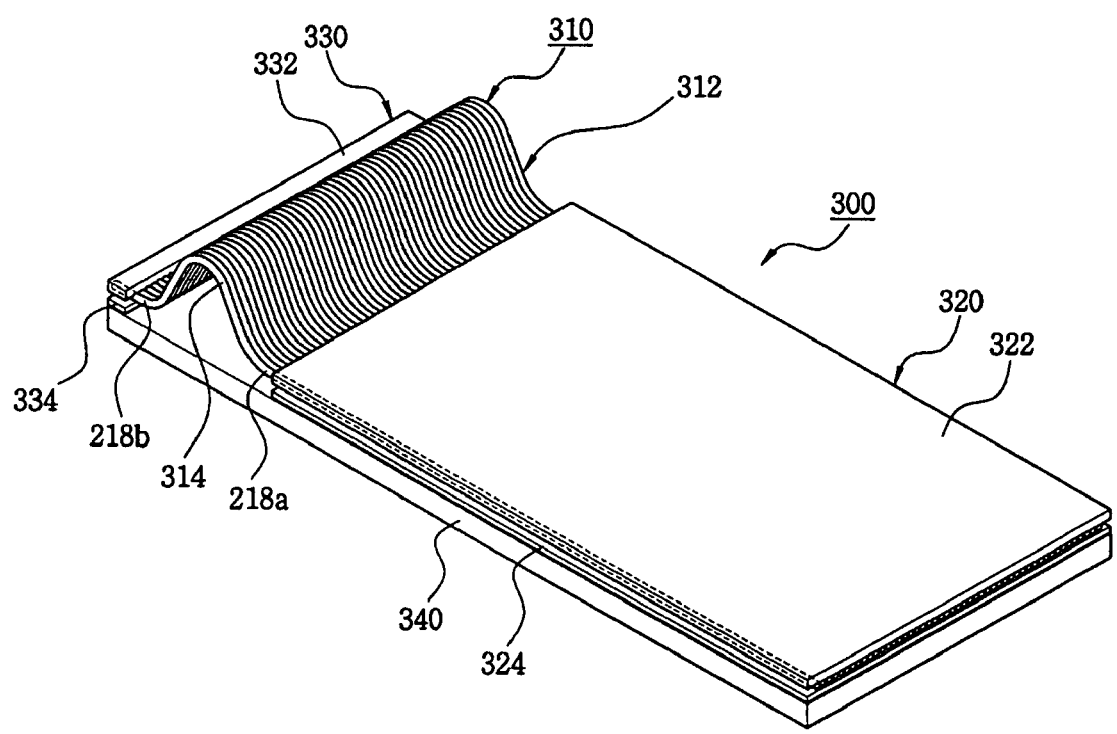
FIG. 7 is a perspective view showing a probe card in accordance with a third embodiment of the present invention.
Figure 8:
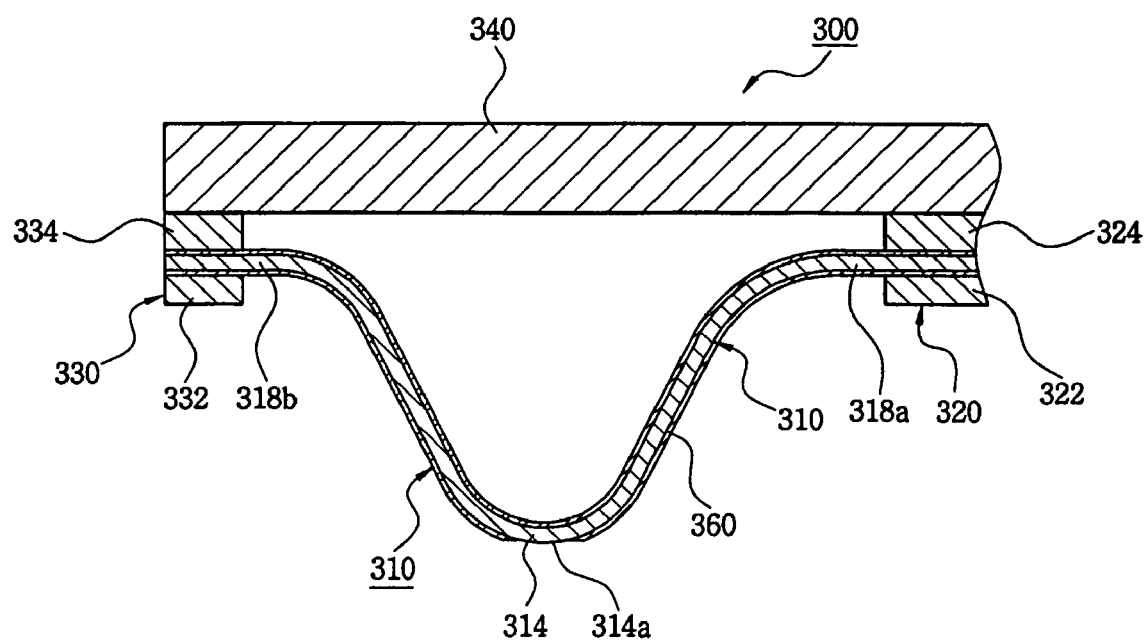
FIG. 8 is a partially cut away sectional view showing a probe card in accordance with a third embodiment of the present invention.

FIGS. 7 and 8 show a probe card in accordance with a third embodiment of the present invention. Just like the probe cards 100, 200 of the first and second embodiments, a probe card 300 according to the third embodiment of the present invention comprises probes 310 composed of conductive wire strands 312, a first insulating block 320, a second insulating block 330 and a mounting plate 340. The conductive wire strands 312 are provided with contact parts 314 protruding outwardly from between the first and second insulating blocks 320, 330 in one and the same direction.

An insulating layer 360 is coated on the entire surface of the conductive wire strands 312 except for the contact spots 314a of the contact parts 314 which would make contact with electrode pads of a target test object. The step of coating the insulating layer 360 on the conductive wire strands 312 is carried out in advance of forming the contact parts 314. The contact parts 314 are formed before or during the time when the first and second insulating blocks 320, 330 are attached the mounting plate 340. Then, a part of the insulating layer 360 is removed from the contact parts 314 to create the contact spots 314a, as shown in FIG. 8. Removal of the insulating layer 360 can be done by chemical etching, knife cutting, grinding or the like. In the present invention, the conductive wire strands 312 on which the insulating layer 360 is coated may be made of, e.g., gold, silver or copper wire that has been used as a bonding wire for the purpose of connecting a semiconductor circuit.

The probe card 300 composed of the conductive wire strands 312 having the insulating layer 360 are advantageous in disposing the probes 310 at a closer spacing as compared to the probe cards 100, 200 of the first and second embodiments described above. As a result, it becomes possible to dispose the probes 310 with extremely high density in the probe card 300 of the third embodiment.

Figure 9:
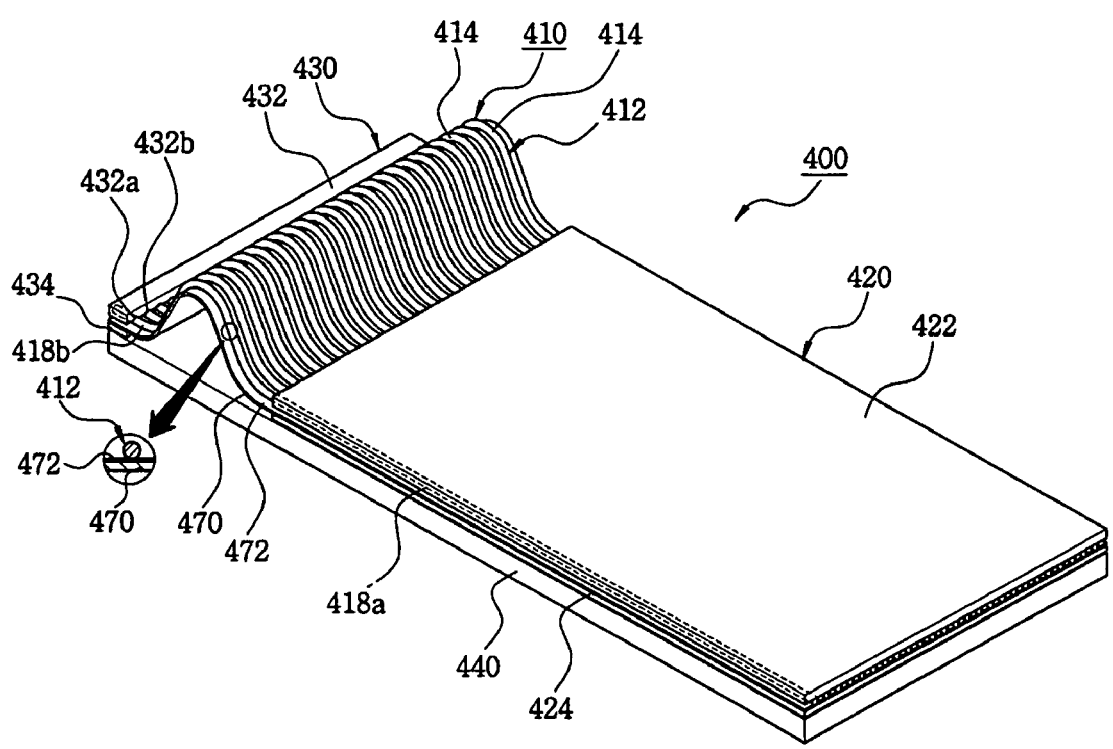
FIG. 9 is a perspective view showing a probe card in accordance with a fourth embodiment of the present invention.

FIG. 9 shows a probe card in accordance with a fourth embodiment of the present invention. Just like the probe cards 100, 200, 300 of the first through third embodiments, a probe card 400 according to the fourth embodiment of the present invention comprises probes 410 composed of conductive wire strands 412, a first insulating block 420, a second insulating block 430 and a mounting plate 440. The conductive wire strands 412 are provided with contact parts 414 protruding outwardly from between the first and second insulating blocks 420, 430 in one and the same direction.

An insulating film 470 is provided between the conductive wire strands 412 and the second plates 424, 434 of the first and the second insulating blocks 420, 430. The insulating film 470 has an adhesive layer 472 on its surface that makes contact with the conductive wire strands 412. The conductive wire strands 412 are disposed on and bonded to the adhesive layer 472 of the insulating film 470 in a mutually spaced-apart parallel relationship. The opposite end parts of the conductive wire strands 412 and the insulating film 470 are fixedly secured to between the first and second plates 422, 424 of the first insulating block 420 and the first and second plates 432, 434 of the second insulating block 430 in such a manner that intermediate parts can extend between the first and second insulating blocks 420, 430. The first insulating block 420 is attached to one end side of the mounting plate 440. The intermediate parts of the conductive wire strands 412 are crushed in their longitudinal directions to form curved contact parts 414 on the conductive wire strands 212, after which the second insulating block 430 is attached to the other end side of the mounting plate 440 in a spaced-apart relationship with respect to the first insulating block 420. Thus, the probe card 400 of the fourth embodiment is produced. As in the second embodiment, it would be possible to dispose a plurality of insulating wire strands between the conductive wire strands 412. It would be also possible that, as in the third embodiment, an insulating layer is coated on the surface of the conductive wire strands 412.

With the probe card 400 of the fourth embodiment, the insulating film 470 serves to reinforce the elastic deformability of the probes 410, thus enabling the contact parts 414 to make contact with electrode pads of a target test object in an accurate and stable manner. Furthermore, the conductive wire strands 412 can be kept spaced apart by way of bonding the conductive wire strands 412 to the insulating film 470 and crushing the conductive wire strands 412 to create the contact parts 414 of curved shape.

Figure 10:
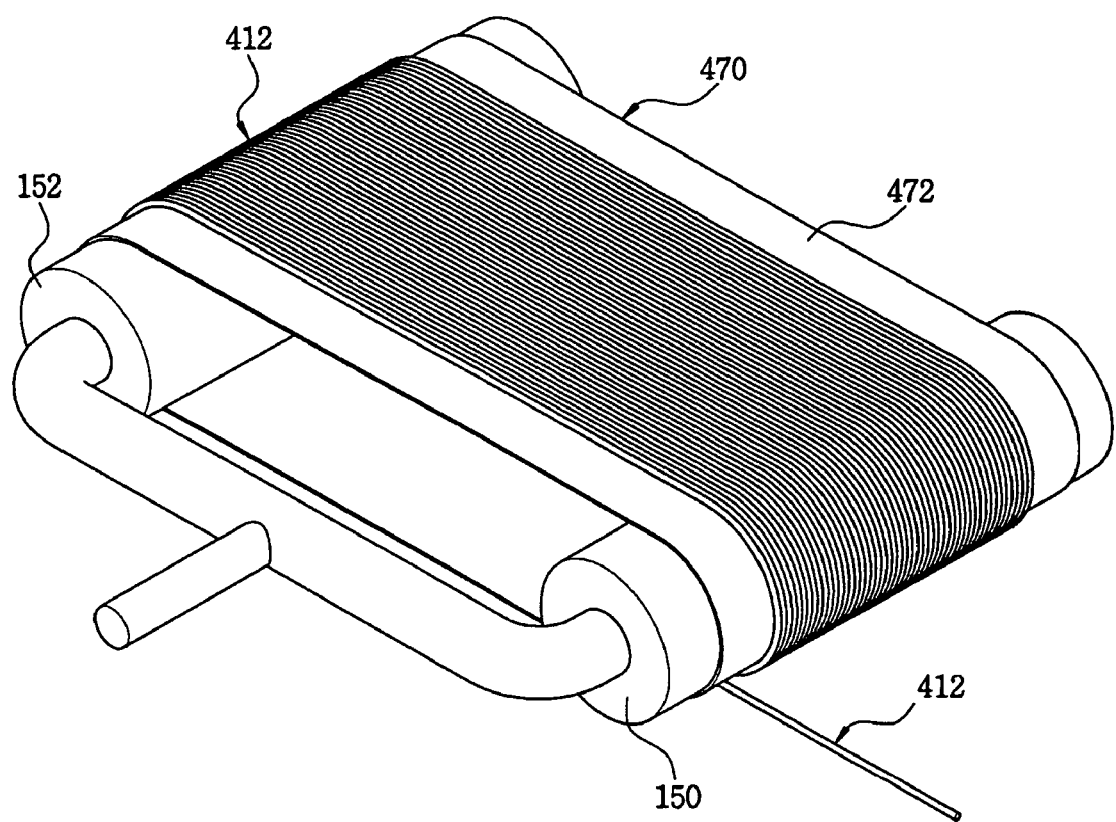
FIG. 10 is a perspective view showing one exemplary method of aligning conductive wire strands on an insulating film in order to produce a probe card according to a fourth embodiment of the present.

Referring to FIG. 10, in order to dispose and bond the conductive wire strands 412 on the adhesive layer 472 of the insulating film 470, the insulating film 470 is wound around first and second spools 150, 152 that are spaced apart at a predetermined spacing. Then, a conductive wire is wound over the adhesive layer 472 of the insulating film 470 to provide the conductive wire strands 412 disposed in a parallel relationship with one another. This ensures that the conductive wire strands 412 are bonded to the adhesive layer 472 of the insulating film 470 at a uniform spacing. The mutually bonded conductive wire strands 412 and insulating film 470 are then severed at their opposite end parts to acquire a sheet of insulating film 470 to which the conductive wire strands 412 are bonded together.

The adhesive layer 472 of the insulating film 470 may be made of a hot-melt adhesive, in which case the conductive wire strands 412 are wound around the adhesive layer 472 while heating. It would be possible to use a resin film with low melting point in place of the insulating film 470 having the adhesive layer 472. In order to have the conductive wire strands 412 bonded to such a resin film, the conductive wire strands 412 should be coated by an adhesive or otherwise the conductive wire strands 412 of naked condition should be wound over the resin film under heating. In case of using the conductive wire strands 412 whose surface is coated with an insulating layer, the conductive wire strands 412 can be bonded to the insulating film 470 by melting the insulating layer with heat or dissolving the insulating layer with chemicals.

Figure 11:
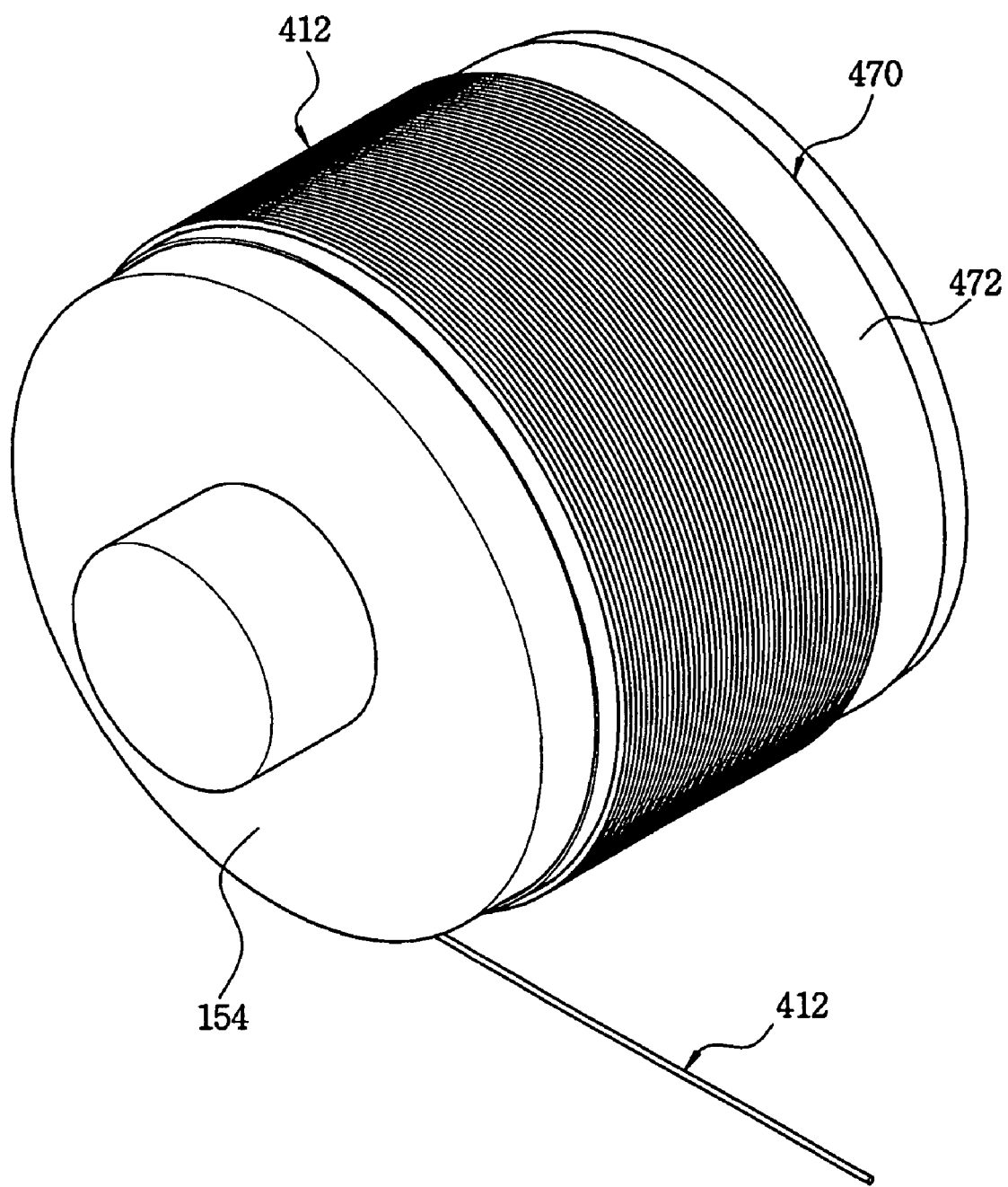
FIG. 11 is a perspective view showing another exemplary method of aligning conductive wire strands on an insulating film in order to produce a probe card according to a fourth embodiment of the present.

FIG. 11 shows a exemplary method of aligning the conductive wire strands on the insulating film in order to produce the probe card according to the fourth embodiment of the present. As shown, the insulating film 470 is wound in multiple turns around a single spool 154 and the conductive wire strands 412 are wound over and bonded to the insulating film 470 in a mutually parallel relationship. The mutually bonded conductive wire strands 412 and insulating film 470 are then severed in a direction parallel to the axis of the spool 154 to acquire a sheet of insulating film 470 to which the conductive wire strands 412 are bonded together.

Figure 12:
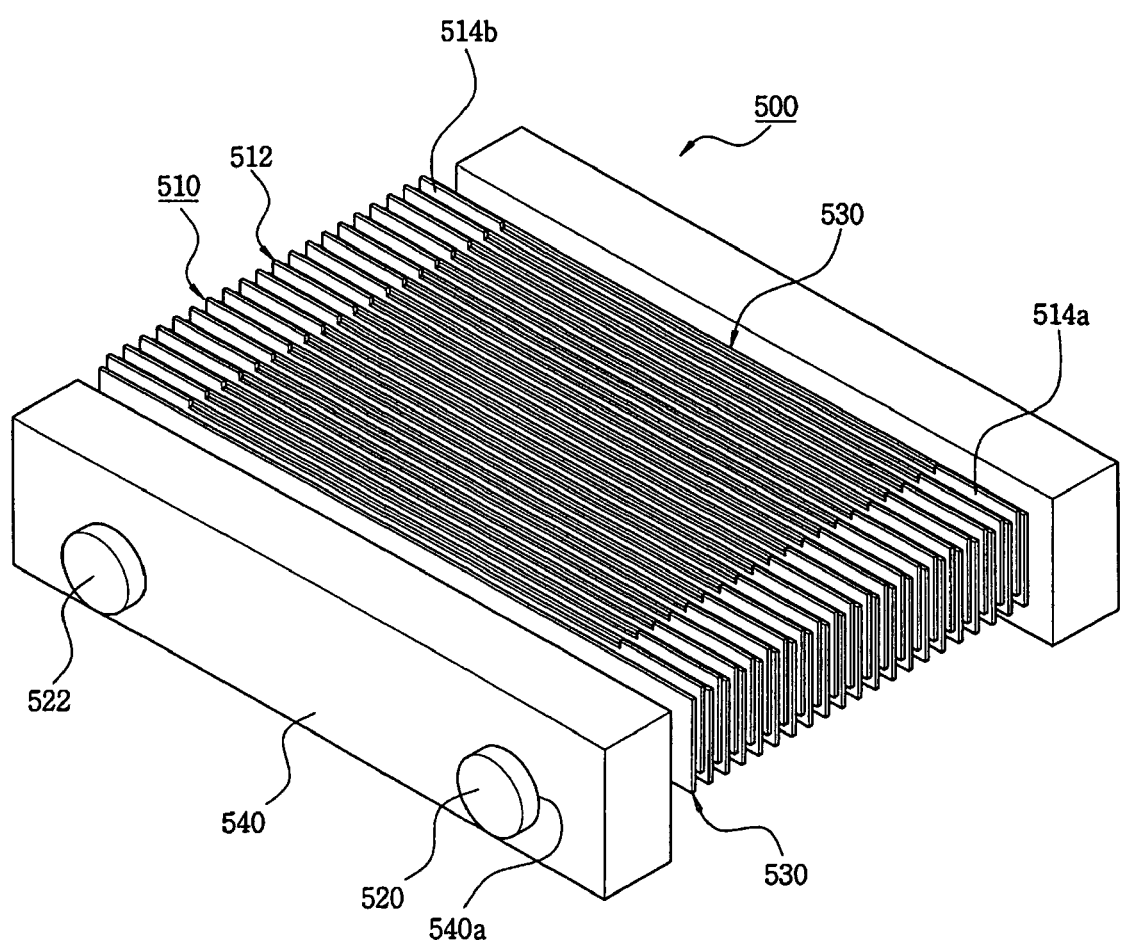
FIG. 12 is a perspective view showing a probe card in accordance with a fifth embodiment of the present invention.
Figure 13:
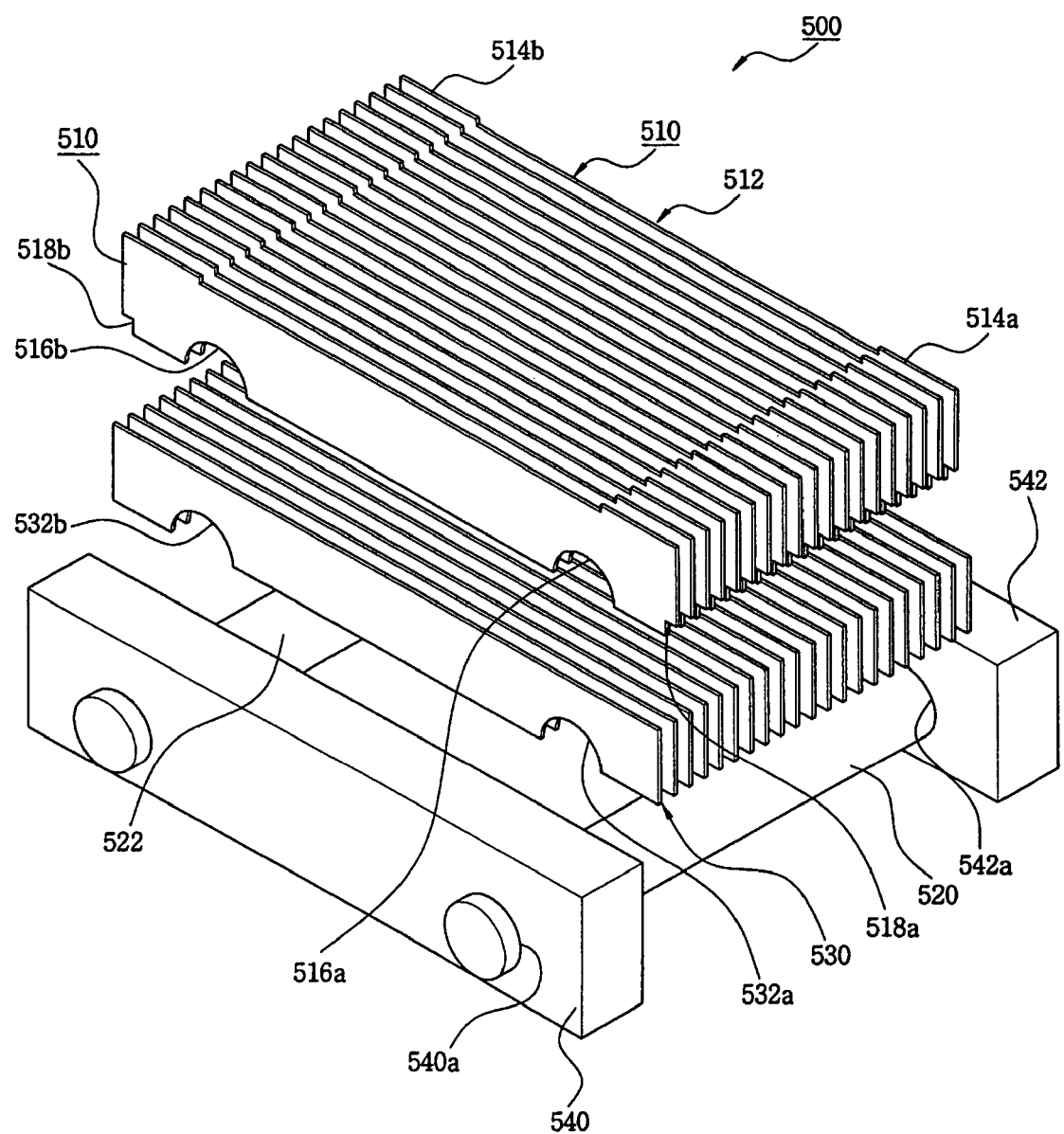
FIG. 13 is a perspective view showing a probe card in accordance with a fifth embodiment of the present invention, with probes separated from insulating sheets.

FIGS. 12 and 13 show a probe card in accordance with a fifth embodiment of the present invention. As shown in these drawings, the probe card 500 of the fifth embodiment comprises a plurality of probes 510 composed of conductive thin plates 512 of generally rectangular configuration. Each of the conductive thin plates 512 has first and second contact parts 514a, 514b at its top opposite sides and first and second coupling recesses 516a, 516b at its bottom opposite sides. Moreover, each of the conductive thin plates 512 is provided at its longitudinal opposite ends with first and second cutouts 518a, 518b that serve to distinguish the conductive thin plates 512 from insulating sheets 530 set forth below.

The first contact parts 514a of the conductive thin plates 512 are adapted to make contact with electrode pads of a target test object to thereby apply electrical signals to the target test object therethrough. The second contact parts 514b of the conductive thin plates 512 can be connected to a tape carrier package block 12 of a probing station 10 illustrated only in FIG. 1. First and second support bases 520, 522 are coupled with the first and second coupling recesses 516a, 516b of the conductive thin plates 512.

Although the first and second coupling recesses 516a, 516b are of semicircular shape and the first and second support bases 520, 522 are composed of rods in the embodiment illustrated in FIG. 12, the coupling recesses 516a, 516b and the support bases 520, 522 may have other shapes, e.g., polygonal configuration, if desired.

A plurality of insulating sheets 530 are disposed between the probes 510 for the purpose of preventing occurrence of short-circuit. Each of the insulating sheets 530 has first and second coupling recesses 532a, 532b at its bottom opposite sides, which correspond to the first and second support bases 520, 522. First and second embracing plates 540, 542 for pressing the probes 510 against one another are provided at opposite ends of the first and second support bases 520, 522. Each of the first and second embracing plates 540, 542 has guide holes 540a, 542a through which the first and second support bases 520, 522 are inserted to allow displacement of the embracing plates 540, 542 therealong. The first and second embracing plates 540, 542 are affixed in place by a fastener means not shown in the drawings.

With the probe card 500 of the fifth embodiment described above, if one of the conductive thin plates 512 is damaged while in use, the user can displace the first and second embracing plates 540, 542 outwardly along the first and second support bases 520, 522, thereby relieving the pressing force imparted to the conductive thin plates 512 and the insulating sheets 530. This allows the user to separate the damaged one of the conductive thin plates 512 away from the first and second support bases 520, 522 and replace it with a new conductive thin plate. At this time, the cutouts 518a, 518b formed at the longitudinal opposite ends of the insulating sheets 530 enables the user to distinguish the conductive thin plates 512 from the insulating sheets 530, thus improving the convenience in the process of changing the conductive thin plates 512.

Figure 14:
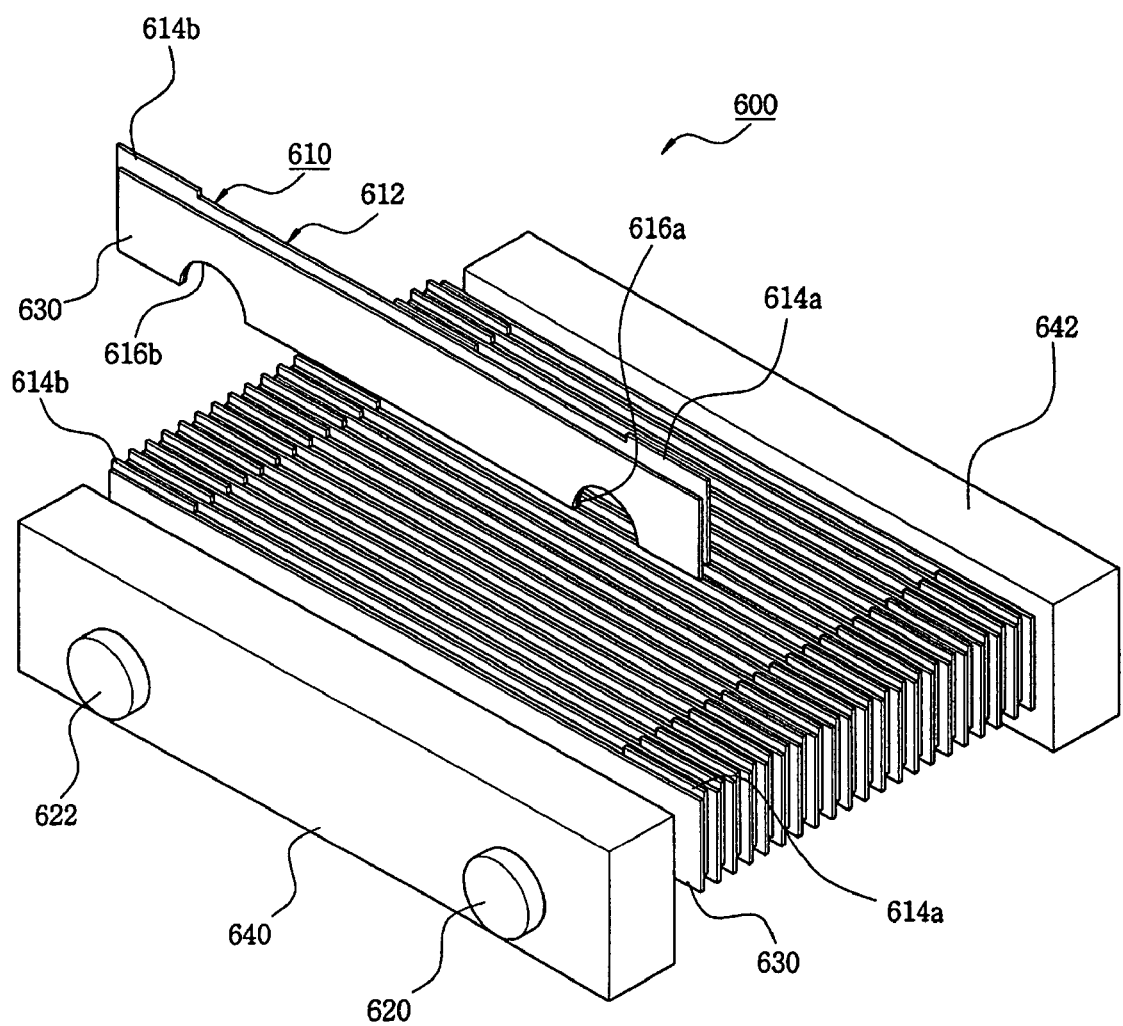
FIG. 14 is a perspective view showing a probe card in accordance with a sixth embodiment of the present invention.

FIG. 14 shows a probe card in accordance with a sixth embodiment of the present invention. As shown, a probe card 600 of the sixth embodiment comprises a plurality of probes 610, first and second support bases 620, 622, and first and second embracing plates 640, 642, all of which are substantially the same as the corresponding components of the probe card 500 according to the fifth embodiment.

The probes 610 are composed of conductive thin plates 612. Each of the conductive thin plates 612 has first and second contact parts 614a, 614b at its top opposite sides and first and second coupling recesses 616a, 616b at its bottom opposite sides. First and second support bases 620, 622 are coupled with the first and second coupling recesses 616a, 616b of the conductive thin plates 612. First and second embracing plates 640, 642 for pressing the probes 610 against one another are provided at opposite ends of the first and second support bases 620, 622.

An insulating layer 630 is provided on one major flank surface of each of the conductive thin plates 612 except for the first and second contact parts 614a, 614b. The insulating layer 630 may be either an insulating tape bonded to the conductive thin plates 612 or an insulating material coated on the conductive thin plates 612. In the latter case, the insulating material is first coated on one entire surface of each of the conductive thin plates 512 and those parts of the coated insulating material corresponding to the first and second contact parts 614a, 614b are removed by chemical etching, knife cutting, grinding or the like. In an effort to improve productivity, it would be possible to produce the probes 610 by way of cutting a wide metal sheet with an insulating layer into a plurality of plate pieces through water jet cutting, press forming or the other suitable cutting methods.

The probe card 600 of the sixth embodiment having the conductive thin plates 612 coated with the insulating layer 630 is simple in structure and can be produced with increased productivity and in a cost-effective manner, as compared to the probe card 500 of the fifth embodiment that makes use of the insulating sheets 530 to provide insulation between the probes 510.

As described in the foregoing, in accordance with the present invention, it becomes possible to provide a probe card that, while exhibiting excellent durability and improved reliability, can enhance elastic deformability of individual conductive probes and accommodate positional errors between the probes and electrode pads of a target test object to thereby assure stabilized and reliable contact the probes with the electrode pads. Furthermore, individual probes can be produced, fitted and changed with ease, thus enabling a probe card to be produced with enhanced productivity and reduced production costs. In addition, the probe card can positively prevent occurrence of short-circuit between individual probe cards through the use of simple and easy-to-form insulating means. According to a probe card production method of the present invention, a probe card having enhanced reliability can be easily produced with increased productivity and reduced costs.

Although certain preferred embodiments of the present invention have been described in detail, it will be apparent to those skilled in the art that various changes or modifications may be made thereto within the scope of the invention defined by the appended claims.

What is claimed is:

1. A probe card, comprising:
   a plurality of probes composed of conductive wire strands and having elastically deformable contact parts so curved as to make contact with electrode pads of a target test object, the contact parts oriented in one and the same direction and extending in a parallel relationship with one another;
   a first insulating block for fixedly securing one end parts of the probes;
   a second insulating block for fixedly securing the opposite end parts of the probes; and
   a mounting plate for holding the first and second insulating blocks in such a manner that the contact parts of the probes protrude outwardly from between the first and second insulating blocks;
   wherein the conductive wire strands are in a pre-stressed state.

2. The probe card as defined in claim 1, wherein the contact parts of the conductive wire strands are elastically deformable, without being susceptible to plastic deformation, under a vertically applied load.

3. The probe card as defined in claim 1, wherein the contact parts of the conductive wire strands, when pressed against the electrode pads of the target test object by a vertically applied load, are elastically deformable, without being susceptible to plastic deformation, so as to enlarge a contact area between the contact parts and the electrode pads.

4. The probe card as defined in claim 1, wherein the opposite end parts of each of the probes are placed one upon another so as to shape the contact part between said opposite end parts as a loop.

5. A probe card, comprising:
   a plurality of probes composed of conductive wire strands, the wire strands having first end parts, second end parts and elastically deformable intermediate contact parts so curved as to make contact with electrode pads of a target test object, the intermediate contact parts oriented in one and the same direction and extending in a parallel relationship with one another; and
   means for fixedly holding the first and second end parts of the conductive wire strands in such a manner that the intermediate contact parts protrude in one direction from between the first and second end parts of the conductive wire strands;
   wherein the conductive wire strands are pre-stressed with the first and second end parts being restricted.

6. The probe card as defined in claim 5, wherein the intermediate contact parts of the conductive wire strands are elastically deformable, without being susceptible to plastic deformation, when pressed against the electrode pads of the target test object by a vertically applied load.

7. The probe card as defined in claim 5, wherein the intermediate contact parts of the conductive wire strands, when pressed against the electrode pads of the target test object by a vertically applied load, are elastically deformable, without being susceptible to plastic deformation, so as to enlarge a contact area between the intermediate contact parts and the electrode pads.

8. The probe card as defined in claim 5, wherein the intermediate contact part of each of the conductive wire strands is loop-shaped while the respective first and second end parts are placed one upon another.

* * * * *